United States Patent
Enguent

(10) Patent No.: US 6,181,152 B1
(45) Date of Patent: Jan. 30, 2001

(54) METHOD AND SYSTEM FOR TESTING AN INTEGRATED CIRCUIT INPUT CAPACITANCE, PARTICULARLY FOR A CONTACTLESS OPERATING INTEGRATED CIRCUIT

(75) Inventor: Jean-Pierre Enguent, Saint Savournin (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/193,768

(22) Filed: Nov. 17, 1998

(30) Foreign Application Priority Data

| Nov. 18, 1997 | (FR) | ................ 97 14685 |
| May 6, 1998 | (FR) | ................ 98 05986 |

(51) Int. Cl.$^7$ ............................ G01R 31/26; G01R 27/28
(52) U.S. Cl. .............................. 324/765; 324/652
(58) Field of Search ...................... 327/765, 522, 327/538, 527, 609, 763, 652, 655, 658, 687, 682, 686, 633, 713, 528

(56) References Cited

U.S. PATENT DOCUMENTS

| 3,732,490 | * | 5/1973 | Botka | ...................... 324/609 |
| 4,659,983 | * | 4/1987 | Jacob | ...................... 324/522 |
| 4,973,912 | * | 11/1990 | Kaminski et al. | .................. 324/652 |
| 5,124,660 | * | 6/1992 | Cilingirioglu | ...................... 324/538 |
| 5,696,451 | * | 12/1997 | Keirn et al. | ...................... 324/687 |

FOREIGN PATENT DOCUMENTS

| 42 15 957 A1 | 11/1993 | (DE) | ............................. G08B/17/00 |
| 2 111 222 | 6/1983 | (GB) | ............................. G01R/31/02 |

OTHER PUBLICATIONS

Patent Abstracts of Japan, vol. 098, No. 002, Jan. 30, 1998 and JP 09 259233A (Mitsubishi Electric Corp.; Mitsubishi Denki Semiconductor Software KK), Oct. 3, 1997.

* cited by examiner

*Primary Examiner*—Safet Metjahic
*Assistant Examiner*—Anjan Deb
(74) *Attorney, Agent, or Firm*—Theodore E. Galanthay; Allen, Dyer, Doppelt, Milbrath & Gilchrist, P.A.

(57) ABSTRACT

A method for testing an integrated circuit comprising an input capacitance designed to form, with an antenna coil, a resonant receiver circuit with a predetermined natural frequency. The input capacitance is connected to a test inductance chosen to form, with the input capacitance, a resonant test circuit having a resonant frequency substantially equal to the natural frequency of the resonant receiver circuit. The resonant test circuit is excited by an alternating signal provided through a transformer. The testing of inductive integrated circuits working without contact is implemented in a corresponding test system.

35 Claims, 3 Drawing Sheets

METHOD AND SYSTEM FOR TESTING AN INTEGRATED CIRCUIT INPUT CAPACITANCE, PARTICULARLY FOR A CONTACTLESS OPERATING INTEGRATED CIRCUIT

FIELD OF THE INVENTION

The present invention relates to a testing circuit and, more particularly, to a method and system for testing an integrated circuit with contactless operation.

BACKGROUND OF THE INVENTION

FIG. 1 illustrates a schematic view of a structure of an integrated circuit 1 for contactless operation. This circuit is of a type mounted in contactless chip cards, electronic labels, and other portable devices that work without contact. The circuit 1 comprises an input stage 10, a rectifier circuit 15, a demodulator circuit 20, a modulator circuit 21, and a central processor unit (CPU) 22. The CPU 22 comprises, for example, a microprocessor and an EEPROM. The input stage 10 is a parallel resonant circuit comprising an input capacitance $C_{in}$ integrated into the silicon, and at least one antenna coil 11 connected to the terminals of the capacitance $C_{in}$ by connection pads 12. The resonant frequency or natural frequency Fp of the input stage 10 is governed by a regulation, and is generally equal to 13.56 MHz.

When the integrated circuit 1 is subjected to an alternating magnetic field Fld with a frequency Fp, an alternating voltage Vac is received in the antenna coil 11 by electromagnetic induction. The alternating magnetic field Fld is emitted, for example, by a station 30 fitted with a coil 31. This voltage Vac could reach 40 volts and is converted by the rectifier circuit 15 into a direct voltage Vcc for the supply of the integrated circuit. Furthermore, the voltage Vac is demodulated by the circuit 20 for the reception of data DTIN. For the transmission of data DTOUT to the station 30, the voltage Vac is modulated by the circuit 21 according to the standard technique of load modulation. Naturally, various other standard techniques may be implemented for the reception or transmission of data. For example, techniques using infrared, radioelectric or other signals are acceptable. In every case, however, activation of the integrated circuit 1 by induction requires that the input stage 10 be excited by a magnetic field.

Like other integrated circuits, the contactless circuits are manufactured in batches on a silicon wafer. However, at this stage of manufacture, the input stage 10 is not completed and does not include the antenna coil 11. It is only after cutting of the wafer that the antenna coil 11 is connected to the capacitance $C_{in}$ before the input stage 10 becomes operational. After cutting the wafer, each integrated circuit is individually mounted on a support, such as a plastic card. The integrated circuits are then activated by a magnetic field and electrically tested to eliminate those that are defective.

The manufacturing output values for integrated circuits are mediocre, and a wafer generally contains various circuits that are defective. The sorting out of such defective circuits requires their assembly on supports and their connection to antenna coils. This effort leads to a waste of labor and raw materials which increases the cost of the portable contactless devices. Thus, the present invention proposes to implement a method of testing on wafer to assess the electrical characteristics of contactless circuits before they are cut out from the silicon wafers.

The implementation of an on wafer testing method requires application to the input stage of each circuit a test voltage simulating the alternating voltage Vac received by induction. This test voltage must be about 20 to 40 volts peak-to-peak with a frequency of about 13.56 MHz. Typically, the most efficient HF signal generators available in the market deliver voltages that do not exceed a few volts. They cannot be used to activate integrated circuits working by induction.

SUMMARY OF THE INVENTION

An object of the present invention is to provide a method and a system enabling application to the input stage of a contactless integrated circuit of an HF testing voltage that can go up to several tens of volts.

Another object of the of the present invention is to provide a test voltage having a high supply current that can go up to about a hundred milliamperes or more.

These objects are achieved by a method for testing an integrated circuit comprising an input capacitance designed to form, with an antenna coil, a resonant receiver circuit with a predetermined natural frequency. The method is applicable to the integrated circuit before being connected to the antenna coil. The method comprises the steps of connecting the input capacitance of the integrated circuit to a test inductance chosen to form, with the input capacitance, a resonant test circuit having a resonant frequency substantially equal to the natural frequency of the resonant receiver circuit. The resonant test circuit is then excited by an alternating signal through a transformer.

According to one aspect of the invention, a first transformer has at its secondary winding a leakage inductance that forms all or part of the test inductance. The first transformer may be a ring type transformer whose primary and secondary windings do not overlap.

According to yet another aspect of the invention, the test inductance comprises a parasitic inductance of an electrical link between the secondary winding of the first transformer and the input capacitance of the integrated circuit. The secondary winding of the first transformer may be connected to the terminals of the input capacitance by metal tips.

According to still another aspect of the invention, the method is applied to the testing of the input capacitance of the integrated circuit and/or to the testing of means for connecting the input capacitance to an antenna coil. This method comprises the steps of measuring the current that flows through the primary winding of the first transformer and measuring the voltage present across the terminals of the input capacitance.

According to yet another aspect of the invention, the current flowing through the primary winding of the first transformer is measured on the secondary winding of a second transformer whose primary winding is series-connected with the primary winding of the first transformer.

According to another aspect of the invention, the voltage present at the terminals of the input capacitance is measured on the secondary winding of a third transformer whose primary winding is connected to the terminals of the input capacitance.

The present invention also provides for a system to test an integrated circuit comprising an input capacitance designed to form, with an antenna coil, a resonant receiver circuit with a predetermined natural frequency. The system comprises a first transformer connected by its primary winding to a voltage source or alternating current source, and means for connecting the secondary winding of the transformer to the terminals of the input capacitance of the integrated circuit.

According to one aspect of the invention, the first transformer has a leakage inductance at its secondary winding which forms with the input capacitance of the integrated circuit a resonant test circuit whose resonant frequency is substantially equal to the natural frequency of the resonant receiver circuit.

According to another aspect of the invention, the resonant test circuit comprises a parasitic inductance that is present in the connection means.

According to yet another aspect of the invention, the first transformer is a ring type transformer.

According to another aspect of the invention, the connection means comprise a printed circuit card provided with metal tips.

According to still another aspect of the invention, the system comprises means to measure the current flowing through the primary winding of the first transformer and means to measure the voltage present at the terminals of the input capacitance. The means for measuring the current flowing through the primary winding of the first transformer comprises a second transformer whose primary winding is series-connected with the primary winding of the first transformer. The means for measuring the voltage present at the terminals of the input capacitance comprises a third transformer whose primary winding is connected to the terminals of the input capacitance.

BRIEF DESCRIPTION OF THE DRAWINGS

These features and advantages are explained in greater detail in the following description of a testing method and system according to the present invention, made with reference to the appended figures, of which.

DETAILED DESCRIPTION OF THE PREFERRED EMBODIMENTS

Figure 1:
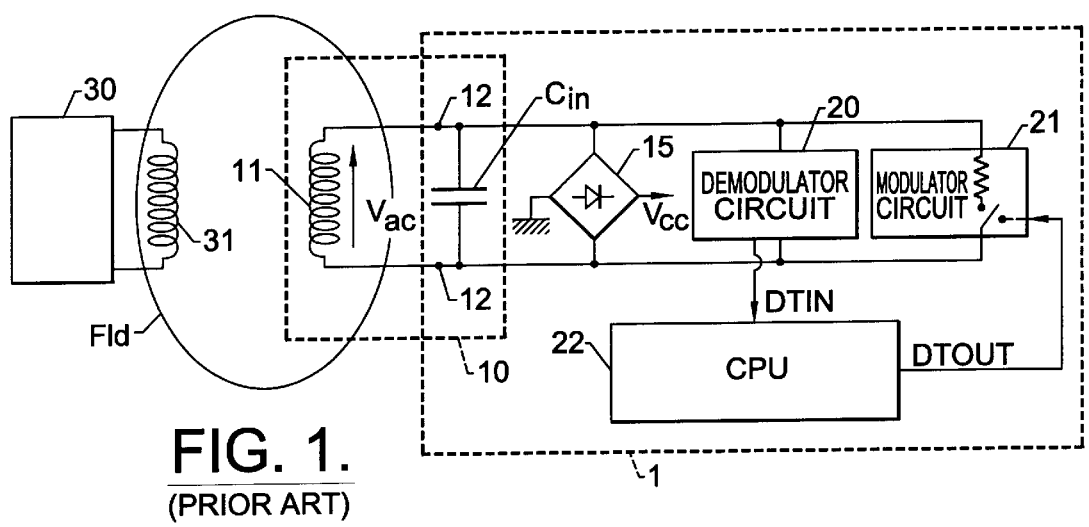
FIG. 1 shows an electrical diagram representing a contactless integrated circuit, according to the prior art.
Figure 2:
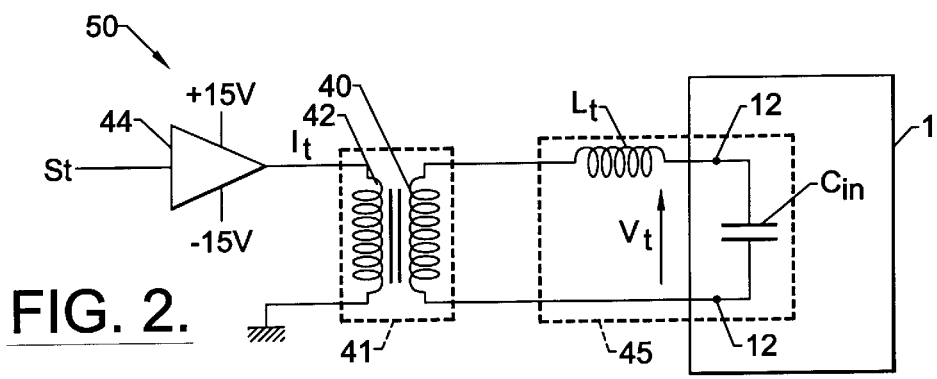
FIG. 2 shows an electrical diagram of an embodiment of a test system for testing a contactless integrated circuit without its antenna coil, according to the present invention.

FIG. 2 shows a testing system 50 according to the present invention, and FIG. 2 also serves to illustrate a method for testing according to the present invention. This figure shows the integrated circuit 1 of FIG. 1, except for the antenna coil 11. Only the input capacitance $C_{in}$ and the connection pads 12 are shown for the integrated circuit 1.

According to the invention, the input capacitance $C_{in}$ of the integrated circuit is series-connected with a test inductance Lt chosen to meet the relationship:

$$Lt=1/(2\pi Fp^2 C_{in}) \quad (1)$$

The test inductance Lt forms with the capacitance $C_{in}$ a resonant circuit 45 whose resonant frequency is substantially equal to the frequency Fp. As indicated in the introduction, the frequency Fp is the natural frequency of the input stage 10 of the integrated circuit 1 when fitted with an antenna coil. The frequency Fp is generally equal to 13.56 MHz, according to prevailing standards. The testing circuit 45 is connected to the secondary winding 40 of a transformer 41 receiving, at its primary winding 42, the output of a voltage/current amplifier 44. The amplifier 44 is driven at its input IN by an AC signal St having an amplitude of only a few volts with a frequency Fp. The amplifier 44 delivers an alternating current It of the same frequency to the primary winding 42 of the transformer.

Advantageously, using a low-value AC signal St and by a resonance effect, a high-amplitude test voltage Vt is generated at the terminals of the capacitance $C_{in}$. This test voltage can easily reach a peak-to-peak voltage value of 40 volts. The amplifier 44 is supplied, for example, with symmetrical voltages of +15 V and −15 V. Providing an amplifier 44 with a linear response makes it possible to supply the integrated circuit 1 with a high supply current of about several hundreds of milliamperes. Another advantage of the transformer 41 is that it electrically insulates the integrated circuit from the amplifier 44 (the test voltage Vt is a floating voltage), and provides natural protection against short circuits.

Figure 3:
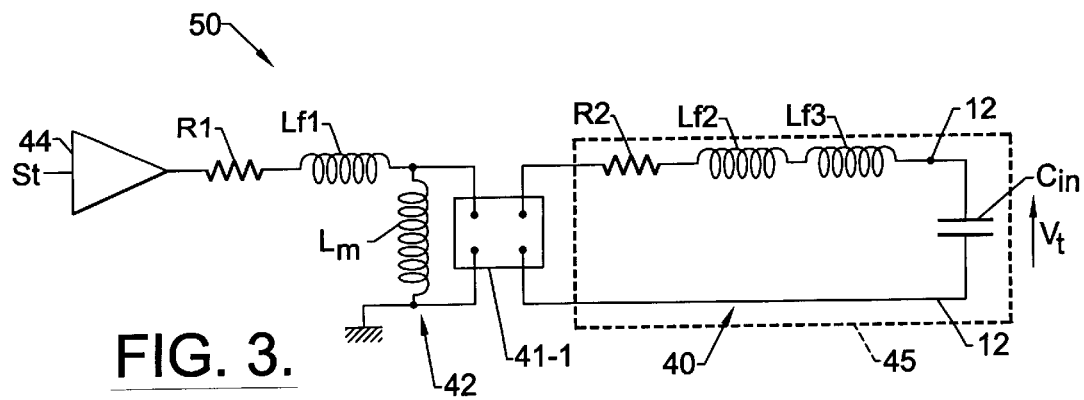
FIG. 3 shows an electrical diagram of an alternative embodiment of a test system for testing a contactless integrated circuit without its antenna coil, according to the present invention.

Another advantageous approach of the method according to the present invention is illustrated in FIG. 3. Referring to FIG. 3, the transformer 41 as seen from its secondary winding 40 is designed to have a leakage inductance Lf2 that meets the above relationship (1). In this case, the resonant test circuit 45 is formed by the leakage inductance Lf2 of the transformer and the capacitance $C_{in}$. The transformer 41 is represented in FIG. 3 by its equivalent diagram according to conventional rules. Reference 41-1 designates an ideal transformer. The primary winding 42 is represented schematically by a resistor R1 series-connected with a leakage inductance Lf1 of the primary winding, and a parallel-connected magnetizing inductance Lm. The secondary winding 40 is represented schematically by a resistor R2 (that may be considered to be negligible) series-connected with the leakage inductance Lf2 which thus, on its own, comprises the test inductance Lt.

Forming a transformer with a leakage inductance at its secondary winding that meets the relationship (1) is within the scope of those skilled in the art, and requires several finalizing tests. The leakage inductance may be adjusted by changing the geometry of the primary and secondary layers of the transformer. The leakage inductance is preferably chosen at its maximum value (for a given transformer structure) so that the common mode current at an input to the primary winding is as low as possible.

According to the invention, a ring type transformer is provided whose core comprises a material having, at the frequency Fp, high magnetic permeability and low magnetic losses. Preferably, the turns of the primary and secondary winding do not overlap to obtain a major leakage inductance. Trials conducted using a 10 mm diameter ferromagnetic ring, made of the material 4C65 by Phillips have provided good results. The transformer has 10 turns at the primary winding and at the secondary winding, and a leakage inductance of about 700 nH.

It is also necessary to take into account the parasitic inductances that may appear in the electrical link between the secondary winding 40 of the transformer and the capacitance $C_{in}$. Two cases may be considered. In the first case, the electrical link has a parasitic inductance Lf3 that cannot be overlooked. This parasitic inductance Lf3 is represented by dashes shown in FIG. 3. It is measured and taken into account when the final adjustments are being made to the transformer. More particularly, the leakage inductance Lf2 of the transformer is proportionally reduced so that the sum [Lf2+Lf3] of the two inductances meets the relationship (1). In the second case, the parasitic inductance Lf3 is low and negligible. This result may be achieved by the use of twisted wires or by providing conductive tracks arranged as described below.

It follows from the above discussion that the present invention can have several embodiments. The test inductance Lt may be formed by the leakage inductance Lf2 of the transformer 41 by the inductance of an external coil, or by the combination of the leakage inductance Lf2 and the inductance of an external coil. The various parasitic inductances are taken into account for each case. Furthermore, the overvoltage coefficient and the passband of the test circuit 45 may be adjusted by the insertion of a low-value resistor into the circuit.

Figure 4:
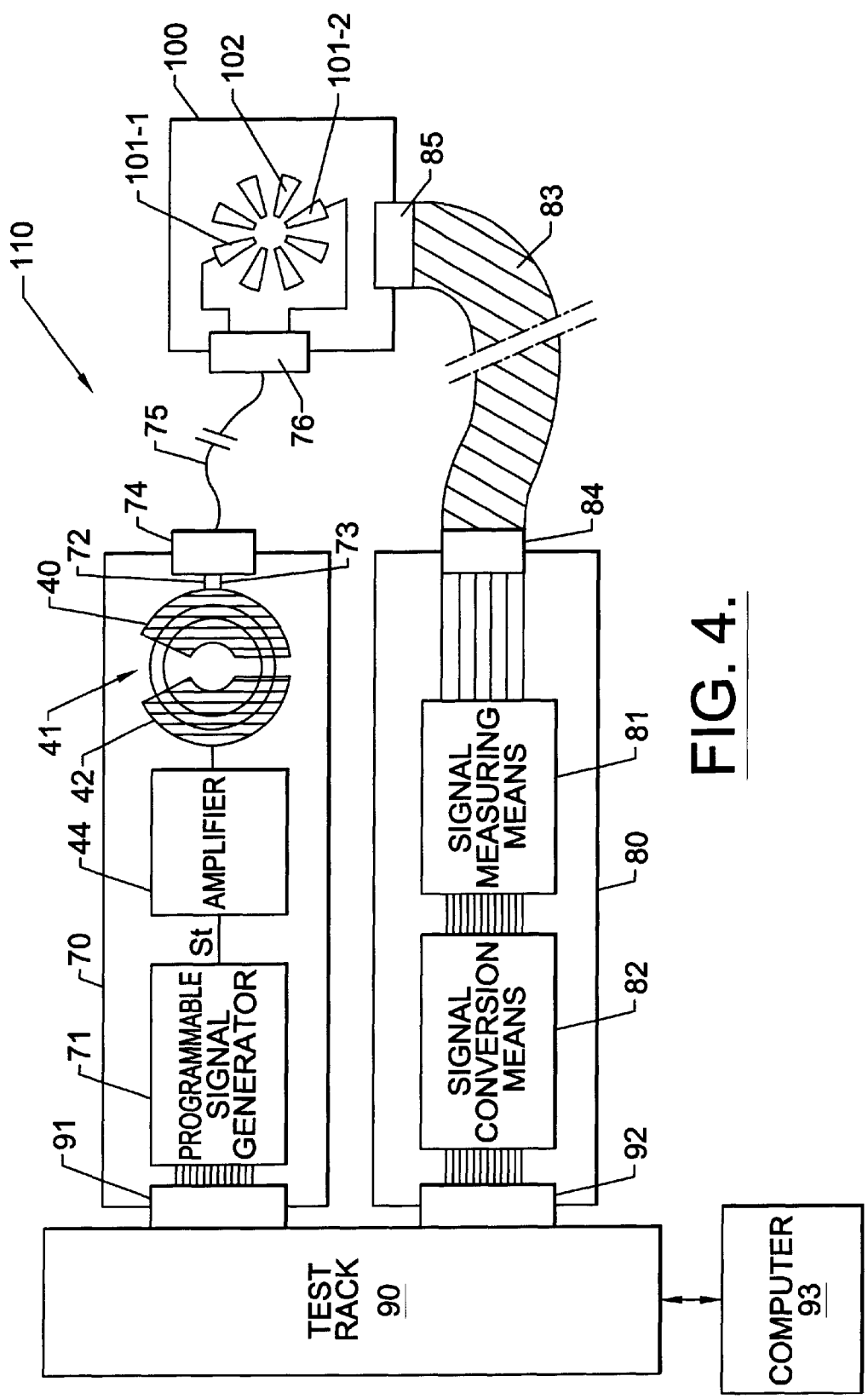
FIG. 4 shows a schematic view of a test stand, according to the present invention.

To illustrate an industrial-scale implementation of the system 50 that has just been described, FIG. 4 shows a schematic view of a test stand 110, according to the present invention. This test stand 110 enables an individual to test contactless integrated circuits in a silicon wafer before they are cut out. As indicated in the introduction, the advantage is defective components can be eliminated before they are mounted on a support and assembled with an antenna coil.

The test stand 110 comprises two printed circuit boards 70, 80 inserted in the drawers of a test rack 90 by connectors 91, 92. The assembly is connected to a computer 93. The board 70 comprises a programmable signal generator 71, an amplifier 44, and a ring type transformer 41. The generator 71 is driven by the computer 93 and delivers the signal St to the input of the amplifier 44. On the surface of the board, two conductive tracks 72, 73 connect the secondary winding 40 of the transformer to a connector 74. These tracks 72, 73 are arranged very close to each other to prevent the formation of a parasitic magnetic field. They thus have negligible parasitic inductance. The board 70 is connected by connector 74, electrical cable 75, and a connector 76 to a board 100 described further below. The electrical cable 75 is formed by twisted wires to have negligible parasitic inductance.

The board 80 comprises means 81 to measure electrical signals and means 82 for the sampling and digital conversion of the signals measured. The board 80 is driven by the computer 93. The measurement means 81 are connected to the board 100 by a bundle of wires 83 and connectors 84, 85. The board 100 is a printed circuit board provided with metal points 101-1, 101-2, 102 arranged to coincide with the test pads of a contactless integrated circuit present on a silicon wafer. Among these metal points, two points 101-1, 101-2 can be seen. These two points are arranged to coincide with the connection pads 12 of the input capacitance $C_{in}$ (FIG. 1). These points 101-1, 101-2 are electrically connected to the secondary winding 40 of the transformer 41 by the connector 76 and the cable 75. The other points 102 of the board 100, whose number is a function of the number of test pads planned in the integrated circuit, are electrically connected to the measurement means 81 by the strip of wires 83.

When the board 100 is brought into contact with an integrated circuit, the secondary winding 40 of the transformer 41 is connected to the capacitance $C_{in}$ by metal points 101-1, 101-2 and the test circuit 45 shown in FIG. 3 is operational. The integrated circuit can be activated as if it were working under real conditions of operation. For example, the programmable generator 71 may, under the control of the computer 73, deliver an amplitude modulated signal St simulating a transfer of digital data. The excess test voltage Vt received by the integrated circuit copies this amplitude modulation. The metal point 102 makes it possible to observe various electrical signals that appear in the integrated circuit, and the computer 93 can carry out a precise analysis of its operation. The operation is repeated on all the integrated circuits present on a silicon wafer. Only an integrated circuit working without contact has been considered. However it must be noted that the present invention can be also applied to hybrid integrated circuits with two modes of operation: a part working without contact, and a part receiving signals through the contact zones.

Figure 5:
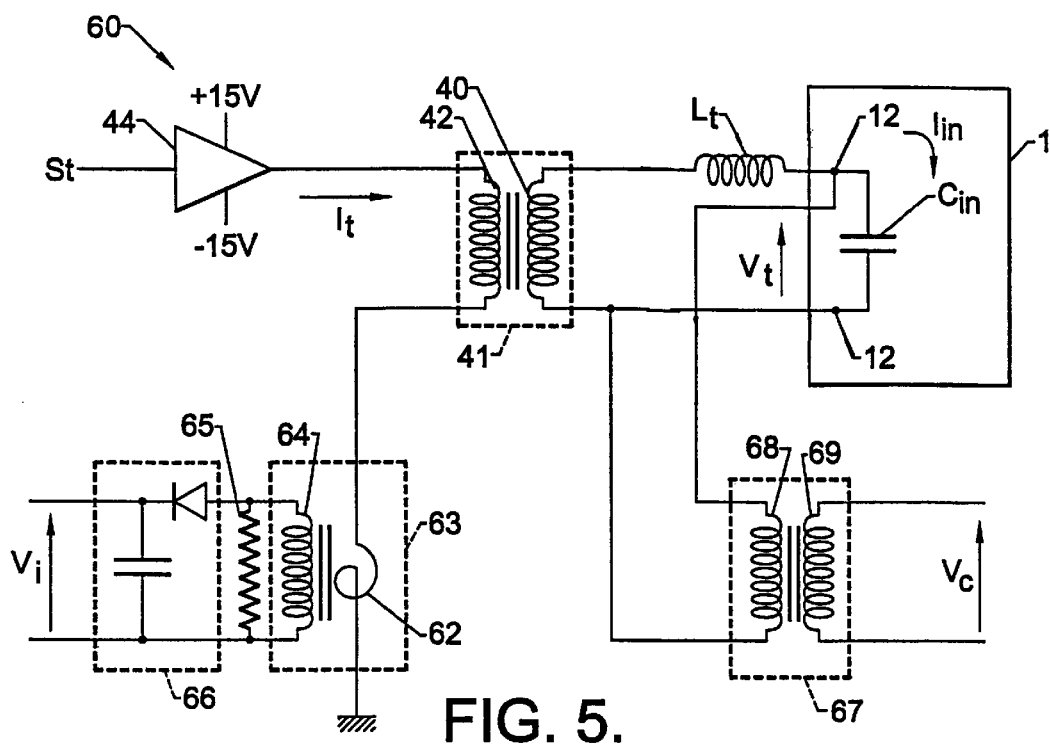
FIG. 5 shows an electrical diagram of an alternative embodiment of the testing system shown in FIG. 2 for testing of an input capacitance of the integrated circuit, according to the present invention.

Furthermore, those skilled in the art will readily realize that the testing system according to the invention is capable of having many alternative embodiments. By way of an example, FIG. 5 shows an alternative embodiment 60 used to measure the value of the input capacitance $C_{in}$ of the integrated circuit 1. The test system 60 comprises the current generating amplifier 44, the transformer 41, and the test inductance Lt (e.g., the leakage inductance of the transformer 41). According to the invention, the end of the primary winding 42 of the transformer 41 is connected to ground by the primary winding 62 of a transformer 63 for forming a simple and practical means of measuring the test current It. Thus, the secondary winding 64 of the transformer 63 is parallel-connected with a load resistor 65 and a rectifier circuit 66. The rectifier circuit 66 is a half-wave rectifier, for example, comprising a diode and a capacitor. The rectifier 66 delivers a voltage Vi that reflects the peak value of the current It. The current It reflects the peak value of the current Iin through the capacitance $C_{in}$.

On the integrated circuit side, the test voltage Vt present at the terminals of the capacitance $C_{in}$ is picked up by a transformer 67 whose primary winding 68 is parallel-connected with the secondary winding 40 of the transformer 41. The secondary winding 69 of the transformer 67 delivers a voltage Vc which reflects the voltage Vt.

According to the embodiment shown, the transformers 41, 67 comprise the same number of turns at the primary winding and at the secondary winding. Accordingly, the voltage Vc is equal to the voltage Vt, and the current It is equal to the current $I_{in}$. Furthermore, the transformer 63 has one primary turn 62 and ten secondary turns 64. Thus, in sinusoidal operation, the peak voltage Vi delivered by the rectifier 66 reflects the current Iin according to the following relationship:

$$I_{in}=(Vi/10/Rm) \qquad (2)$$

where Rm is the value of the load resistor 65.

In this case, the value of the capacitance $C_{in}$ may be determined from the measurement of the voltages Vi and Vc by the following relationship:

$$C_{in}=((Vi/10/Rm)/Vc)/\omega \qquad (3)$$

giving:

$$C_{in}=K\ Vi/Vc \qquad (4)$$

where $\omega$ is the pulsation of the test current It, and K is a constant.

This embodiment of the invention enables the testing of the input capacitance $C_{in}$ before starting the more detailed testing operations. Therefore, detection of defects resulting from the method of forming the capacitance $C_{in}$ is possible The transformers 63, 67 are positioned on the card 70 of the test system of FIG. 4 and are associated with a means for computing the ratio Vi/Vc which delivers, for example, an alarm signal when this ratio is outside a range of permitted values. Since the test inductance Lrt is generally the leakage inductance of the transformer 41, a simple connection of the transformer 67 to the points 101-1, 101-2 enables measurement of the voltage Vt.

Figure 6:
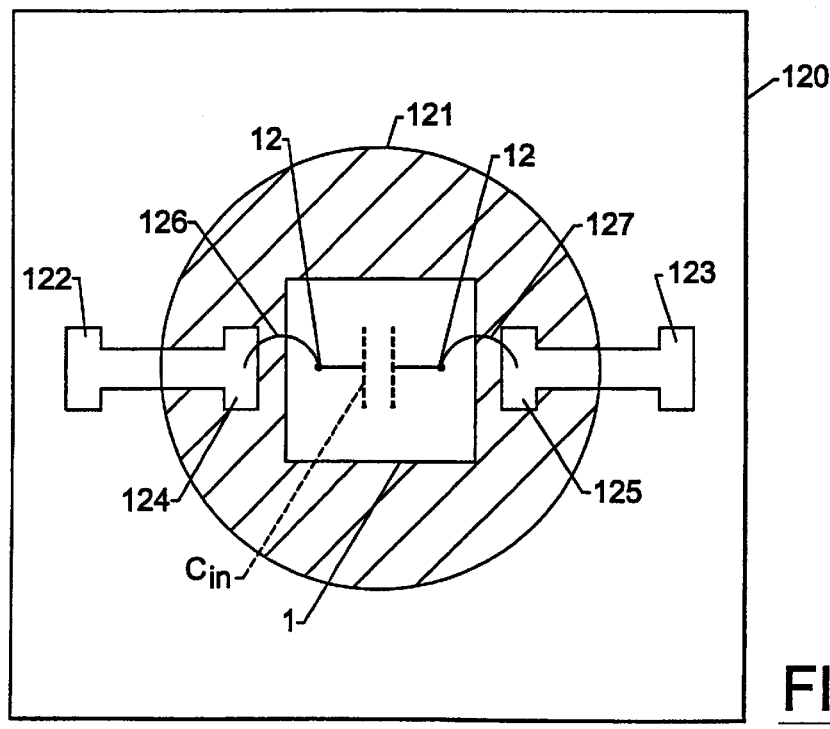
FIG. 6 illustrates an application of the present invention for testing a contactless integrated circuit connected to a chip card micromodule.

Finally, those skilled in the art realize that the present invention is applicable to various applications, and is not limited to the testing of integrated circuits in batches on a silicon wafer. The present invention is generally applicable to the testing of an integrated circuit before it is connected to an antenna coil. FIG. 6 shows an integrated circuit 1 attached to a chip card micromodule 120 and coated in a protective resin 121. The micromodule 120 comprises two zones 122, 123 designed to be connected to an antenna when the micromodule 120 is mounted in a plastic card. The zones 122, 123 are connected by conductive tracks to zones 124, 125. The zones 124, 125 are then connected to the pads 12 of the integrated circuit by wires 126, 127 which are connected by ultrasonic soldering. All these elements are embedded in the resin 121.

Implementation of the method of the invention consists of applying the test points 101-1, 101-2 (FIG. 4) to the zones 122, 123. Thus, the method of the invention makes it possible not only to measure the value of the capacitance $C_{in}$ and test the integrated circuit, but also to detect for connection defects between the zones 122, 123 and the pads 12 of the integrated circuit 1. Connection defects could be, for example, a soldering defect of the wires 126, 127 between the integrated circuit 1 and the zones 124, 125.

What is claimed is:

1. A method for testing a contactless operating integrated circuit comprising an internal input capacitance designed to form, with an antenna coil, an RF resonant receiver circuit, the method being applicable to the contactless operating integrated circuit before connection to the antenna coil, the method comprising the steps of:

connecting the internal input capacitance of the contactless operating integrated circuit to a test inductance chosen to form, with the internal input capacitance, a resonant test circuit having a resonant frequency substantially equal to a natural frequency of the RF resonant receiver circuit; and exciting the resonant test circuit by an alternating signal through a first transformer.

2. A method according to claim 1, wherein the step of exciting is performed through a secondary winding of the first transformer having a leakage inductance that forms substantially all of the test inductance.

3. A method according to claim 1, wherein the step of exciting is performed through a secondary winding of the first transformer having a leakage inductance that forms part of the test inductance.

4. A method according to claim 1, wherein the first transformer is a ring type transformer comprising non-overlapping primary and secondary windings.

5. A method according to claim 1, wherein the test inductance comprises a parasitic inductance of an electrical link between a secondary winding of the first transformer and the internal input capacitance of the integrated circuit.

6. A method according to claim 1, wherein the step of connecting comprises the step of connecting a secondary winding of the first transformer to terminals of the internal input capacitance using metal pads.

7. A method according to claim 1, further comprising the steps of:

measuring a current through a primary winding of the first transformer; and measuring a voltage across terminals of the internal input capacitance.

8. A method according to claim 7, wherein the step of measuring comprises the step of measuring a current on a secondary winding of a second transformer having a primary winding series-connected with the primary winding of the first transformer.

9. A method according to claim 7, wherein the step of measuring a voltage comprises the step of measuring a voltage across a secondary winding of a third transformer.

10. A method for testing contactless operating integrated circuit comprising an internal input capacitance designed to form, with an antenna coil, an RF resonant receiver circuit, the method being applicable to the contactless operating integrated circuit before connection to the antenna coil, the method comprising the steps of:

forming a resonant test circuit having a test inductance chosen to form with the internal input capacitance a resonant frequency substantially equal to a natural frequency of the RF resonant receiver circuit;

connecting the internal input capacitance of the contactless operating integrated circuit to the resonant test circuit;

exciting the resonant test circuit by an alternating signal through a first transformer;

measuring a current through a primary winding of the first transformer; and measuring a voltage across terminals of the internal input capacitance.

11. A method according to claim 10, wherein the step of exciting is performed through a secondary winding of the first transformer having a leakage inductance that forms substantially all of the test inductance.

12. A method according to claim 10, wherein the step of exciting is performed through a secondary winding of the first transformer having a leakage inductance that forms part of the test inductance.

13. A method according to claim 10, wherein the first transformer is a ring type transformer comprising non-overlapping primary and secondary windings.

14. A method according to claim 10, wherein the test inductance comprises a parasitic inductance of an electrical link between a secondary winding of the first transformer and the internal input capacitance of the contactless operating integrated circuit.

15. A method according to claim 10, wherein the step of connecting comprises the step of connecting a secondary winding of the first transformer to terminals of the internal input capacitance using metal pads.

16. A method according to claim 10, wherein the step of measuring comprises the step of measuring a current on a secondary winding of a second transformer having a primary winding series-connected with the primary winding of the first transformer.

17. A method according to claim 10, wherein the step of measuring a voltage comprises the step of measuring a voltage across a secondary winding of a third transformer having a primary winding connected across terminals of the internal input capacitance.

18. A system for testing contactless operating integrated circuit comprising an internal input capacitance designed to form, with an antenna coil, an RF resonant receiver circuit, the system comprising:

a first transformer having a primary winding connected to a power source; and a connecting device for connecting a secondary winding of the first transformer across the internal input capacitance of the contactless operating integrated circuit.

19. A system according to claim 18, wherein said power source comprises a voltage source.

20. A system according to claim 18, wherein said power source comprises an alternating current source.

21. A system according to claim 18, wherein the secondary winding of said first transformer provides a leakage inductance forming with the internal input capacitance of the contactless operating integrated circuit a resonant test circuit having a resonant frequency substantially equal to a natural frequency of the RF resonant receiver circuit.

22. A system according to claim 18, wherein said connecting device for connecting comprises a parasitic inductance.

23. A system according to claim 18, wherein said first transformer comprises a ring type transformer.

24. A system according to claim 18, wherein said connecting device for connecting comprises a printed circuit card comprising metal pads.

25. A system according to claim 18, further comprising:
   a first measurement device for measuring a current in the primary winding of said first transformer; and
   a second mesurement device for measuring a voltage across terminals of the internal input capacitance.

26. A system according to claim 25, wherein said first measurement device for measuring a current comprises a second transformer having a primary winding series-connected with the primary winding of said first transformer.

27. A system according to claim 25, wherein said mesurement device for measuring a voltage comprises a third transformer having a primary winding connected across terminals of the internal input capacitance.

28. A system for testing a contactless operating integrated circuit comprising an internal input capacitance designed to form, with an antenna coil, an RF resonant receiver circuit, the system comprising:
   a first transformer having a primary winding connected to a power source;
   a printed circuit card comprising a plurality of metal pads for connecting a secondary winding of said first transformer across terminals of the internal input capacitance of the contactless operating integrated circuit;
   a first measurement device for measuring a current in the primary winding of said first transformer; and
   a second measurement device for measuring a voltage across the internal input capacitance.

29. A system according to claim 28, wherein the secondary winding of said first transformer provides a leakage inductance forming with the internal input capacitance of the contactless operating integrated circuit a resonant test circuit having a resonant frequency substantially equal to a natural frequency of the RF resonant receiver circuit.

30. A system according to claim 29, wherein the resonant test circuit comprises a parasitic inductance between the secondary winding of said first transformer and the internal input capacitance of the contactless operating integrated circuit.

31. A system according to claim 28, wherein said power source comprises a voltage source.

32. A system according to claim 28, wherein said power source comprises an alternating current source.

33. A system according to claim 28, wherein said first transformer comprises a ring type transformer.

34. A system according to claim 28, wherein said first measurement device for measuring a current comprises a second transformer having a primary winding series-connected with the primary winding of said first transformer.

35. A system according to claim 28, wherein said second measurement device for measuring a voltage comprises a third transformer having a primary winding connected across terminals of the internal input capacitance.

* * * * *

UNITED STATES PATENT AND TRADEMARK OFFICE
CERTIFICATE OF CORRECTION

PATENT NO.   : 6,181,152
DATED        : January 30, 2001
INVENTOR(S)  : Jean-Pierre Enguent It is certified that error appears in the above-identified patent and that said Letters Patent is hereby corrected as shown below:

Column 8, Line 11    Delete: "testing contactless"
                     Insert —testing a contactless—

Column 8, Line 59    Delete: "testing contactless"
                     Insert —testing a contactless—

Column 9, Lines 28   Delete: "said measurement device"
and 29               Insert —said second measurement device—

Signed and Sealed this

Fifth Day of June, 2001

NICHOLAS P. GODICI
*Acting Director of the United States Patent and Trademark Office*

Attest:

*Attesting Officer*